(12) United States Patent
Cao

(10) Patent No.: US 9,947,698 B2
(45) Date of Patent: Apr. 17, 2018

(54) MANUFACTURE METHOD OF OXIDE SEMICONDUCTOR TFT SUBSTRATE AND STRUCTURE THEREOF

(71) Applicants: Shenzhen China Star Optoelectronics Technology Co., Ltd., Shenzhen (CN); Wuhan China Star Optoelectronics Technology Co., Ltd., Wuhan (CN)

(72) Inventor: Shangcao Cao, Shenzhen (CN)

(73) Assignees: SHENZHEN CHINA STAR OPTOELECTRONICS TECHNOLOGY CO., LTD., Shenzhen, Guangdong (CN); WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 176 days.

(21) Appl. No.: 14/779,333

(22) PCT Filed: Aug. 24, 2015

(86) PCT No.: PCT/CN2015/087889
§ 371 (c)(1),
(2) Date: Sep. 23, 2015

(87) PCT Pub. No.: WO2017/024612
PCT Pub. Date: Feb. 16, 2017

(65) Prior Publication Data
US 2017/0162611 A1    Jun. 8, 2017

(30) Foreign Application Priority Data
Aug. 11, 2015  (CN) .......................... 2015 1 0490585

(51) Int. Cl.
*H01L 21/00* (2006.01)
*H01L 27/12* (2006.01)
(Continued)

(52) U.S. Cl.
CPC .... *H01L 27/1288* (2013.01); *H01L 21/02565* (2013.01); *H01L 21/02631* (2013.01);
(Continued)

(58) Field of Classification Search
CPC ......... H01L 21/02565; H01L 21/02631; H01L 27/1225; H01L 27/127; H01L 29/24;
(Continued)

(56) References Cited

U.S. PATENT DOCUMENTS

2015/0333182 A1* 11/2015 Guo .................... H01L 27/1288
257/43
2016/0240687 A1* 8/2016 Hu ...................... H01L 27/1225

FOREIGN PATENT DOCUMENTS

CN    104037090 A    9/2014
CN    104037126 A    9/2014

* cited by examiner

*Primary Examiner* — Richard Booth
(74) *Attorney, Agent, or Firm* — Leong C. Lei

(57) ABSTRACT

The present invention provides a manufacture method of an oxide semiconductor TFT substrate and a structure thereof. The method continuously forms the gate isolation layer (3), the oxide semiconductor layer (4') and the etching stopper layer (5'), and implements pattern process to the oxide semiconductor layer (4') and the etching stopper layer (5') with one halftone mask or a slit diffraction mask to first form an island shaped oxide semiconductor layer (4) and an island shaped etching stopper layer (5) which are stacked up, and then to form blind holes (54) respectively at two sides of the island shaped oxide semiconductor layer (4) and the island shaped etching stopper layer (5); and a depth of the blind hole (54) is larger than a thickness of the island shaped etching stopper layer (5), and smaller than a thickness sum of the island shaped etching stopper layer (5) and the island shaped oxide semiconductor layer (4) and the contact area of the source/the drain of the TFT with the oxide semiconduc-
(Continued)

tor layer (4) is enlarged to reduce the contact resistance and raise the on state current of the TFT.

14 Claims, 7 Drawing Sheets

(51) Int. Cl.
*H01L 29/786* (2006.01)
*H01L 29/24* (2006.01)
*H01L 29/51* (2006.01)
*H01L 29/49* (2006.01)
*H01L 29/45* (2006.01)
*H01L 21/02* (2006.01)

(52) U.S. Cl.
CPC ........ *H01L 27/127* (2013.01); *H01L 27/1225* (2013.01); *H01L 29/24* (2013.01); *H01L 29/45* (2013.01); *H01L 29/4908* (2013.01); *H01L 29/51* (2013.01); *H01L 29/518* (2013.01); *H01L 29/7869* (2013.01)

(58) Field of Classification Search
CPC ..... H01L 29/45; H01L 27/1288; H01L 29/51; H01L 29/518; H01L 29/4908
See application file for complete search history.

MANUFACTURE METHOD OF OXIDE SEMICONDUCTOR TFT SUBSTRATE AND STRUCTURE THEREOF

FIELD OF THE INVENTION

The present invention relates to a display technology field, and more particularly to a manufacture method of an oxide semiconductor TFT substrate and a structure thereof.

BACKGROUND OF THE INVENTION

The flat panel display devices possess many merits of thin frame, power saving, no radiation, etc. and have been widely used. Present flat panel display devices mainly comprise a LCD (Liquid Crystal Display) or an OLED (Organic Light Emitting Display).

Thin Film transistors (TFT) are important components of a flat panel display The TFTs can be formed on a glass substrate and a plastic substrate and generally employed as switch elements and driving elements utilized in the flat panel display devices, such as LCDs, OLEDs and et cetera.

The oxide semiconductor TFT technology is the most popular skill at present. The oxide semiconductor has higher electron mobility. In comparison with the Low Temperature Poly-silicon (LTPS), the oxide semiconductor manufacture process is simpler and possesses higher compatibility with the amorphous silicon process. It can be applicable to the skill fields of Liquid Crystal Display, Organic Light Emitting Display, Flexible Display and etc. Because it fits the new generation production lines and has possible applications for displays with Large, Middle and Small sizes. The oxide semiconductor has the great opportunity of application development.

The oxide semiconductor TFT substrate structure with more development at present is the etch-stopper layer (ESL) structure. FIG. 1 to FIG. 5 sequentially shows the process flows of the common manufacture method of the oxide semiconductor TFT substrate: first, deposing a first metal layer on a substrate 100, and implementing pattern process to the first metal layer with a first mask to form a bottom gate 200; second, deposing a gate isolation layer 300; third, deposing an oxide semiconductor film, and implementing pattern process to the oxide semiconductor film with a second mask to form a oxide semiconductor layer 400; fourth, deposing an etch-stopper layer 500, and implementing pattern process to the etch-stopper layer 500 with a third mask; fifth, deposing a second metal layer, and implementing pattern process to the second metal layer with a fourth mask to form a source/a drain 600.

Several following issues exist in the aforesaid common manufacture method of the oxide semiconductor TFT substrate: A. except the substrate 100, the other layers respectively requires one mask for one complete photolithographic process (including processes of photo, etching, stripping and etc.) for implementing pattern process, and the necessary amount of the masks are more, and the process flow is longer, and the production efficiency is lower and the production cost is higher; B. the interfaces of the oxide semiconductor layer 400, the gate isolation layer 300 and the etch-stopper layer 500 can be easily contaminated with the etchant, stripper, and the risk of the TFT performance degradation exist; C. the contact area of the source/the drain 600 with the oxide semiconductor layer 400 is smaller, and the contact resistance is larger, and the on state current of the TFT is lower.

SUMMARY OF THE INVENTION

An objective of the present invention is to provide a manufacture method of an oxide semiconductor TFT substrate, which can diminish the amount of the masks, to reduce the production cost and raise the production efficiency. The contact area of the source/the drain of the TFT with the oxide semiconductor layer is enlarged to reduce the contact resistance and raise the on state current of the TFT.

Another objective of the present invention is to provide an oxide semiconductor TFT substrate structure, of which the production cost is low, and the production efficiency is high, and the contact area of the source/the drain of the TFT with the oxide semiconductor layer is larger, and the contact resistance is smaller, and the on state current of the TFT is higher.

For realizing the aforesaid objective, the present invention provides a manufacture method of an oxide semiconductor TFT substrate, comprising steps of:

step 1, providing a substrate, and deposing a first metal layer on the substrate, and implementing pattern process to the first metal layer with a first mask to form a gate;

step 2, sequentially and continuously deposing a gate isolation layer, an oxide semiconductor layer and an etching stopper layer on the gate and the substrate;

step 3, implementing pattern process to the oxide semiconductor layer and the etching stopper layer with a second halftone mask or a slit diffraction mask to first form an island shaped oxide semiconductor layer and an island shaped etching stopper layer which are stacked up on the gate isolation layer above the gate, and then to form blind holes respectively at two sides of the island shaped oxide semiconductor layer and the island shaped etching stopper layer;

a depth of the blind hole is larger than a thickness of the island shaped etching stopper layer, and smaller than a thickness sum of the island shaped etching stopper layer and the island shaped oxide semiconductor layer;

step 4, deposing a second metal layer on the island shaped etching stopper layer and gate isolation layer, and implementing pattern process to the second metal layer with a third mask to form a source/a drain;

the source/the drain contact with the island shaped oxide semiconductor layer through a bottom surface and part of hole wall of the blind hole.

The step 3 specifically comprises:

step 31, coating photoresist on the etching stopper layer, and implementing exposure, development to the photoresist with a second halftone mask or a slit diffraction mask to obtain a photoresist layer right above the gate, and two sides of the photoresist layer are respectively provided with sunk areas, and a thickness of the photoresist layer in the sunk areas is smaller than a thickness of the photoresist layer outside the sunk areas;

step 32, employing the entire photoresist layer to be a shielding layer to implement dry etching to the etching stopper layer, and then to implement wet etching to the oxide semiconductor layer to form the island shaped oxide semiconductor layer and the island shaped etching stopper layer which are stacked up;

step 33, removing the photoresist layer in the sunk areas, and leaving the photoresist layer outside the sunk areas;

step 34, employing the left photoresist layer to be a shielding layer to implement dry etching to the island shaped etching stopper layer, and then to implement wet etching to the island shaped oxide semiconductor layer to form the blind holes respectively at the two sides of the island shaped oxide semiconductor layer and the island shaped etching stopper layer;

step 35, removing the left photoresist layer.

Material of the island shaped oxide semiconductor layer is IGZO.

Material of the island shaped etching stopper layer is Silicon Oxide, Silicon Nitride or a combination of the two.

Material of the gate isolation layer is Silicon Oxide, Silicon Nitride or a combination of the two.

Material of the gate and the source/the drain is a stack combination of one or more of molybdenum, titanium, aluminum and copper.

In the step 1, the first metal layer is deposed by physical vapor deposition, and wet etching is employed for implementing pattern process to the first metal layer.

In the step 2, the gate isolation layer is deposed by chemical vapor deposition, and the oxide semiconductor layer is deposed by sputtering, and the etching stopper layer is deposed by chemical vapor deposition in sequence.

In the step 4, the second metal layer is deposed by physical vapor deposition, and wet etching is employed for implementing pattern process to the second metal layer.

The present invention provides an oxide semiconductor TFT substrate structure, comprising a substrate, a gate positioned on the substrate, a gate isolation layer covering the gate and the substrate, an island shaped oxide semiconductor layer and an island shaped etching stopper layer which are stacked up on the gate isolation layer above the gate, and a source/a drain;

blind holes are respectively formed at two sides of the island shaped oxide semiconductor layer and the island shaped etching stopper layer, and a depth of the blind hole is larger than a thickness of the island shaped etching stopper layer, and smaller than a thickness sum of the island shaped etching stopper layer and the island shaped oxide semiconductor layer; the source/the drain contact with the island shaped oxide semiconductor layer through a bottom surface and part of hole wall of the blind hole.

The present invention further provides a manufacture method of an oxide semiconductor TFT substrate, comprising steps of:

step 1, providing a substrate, and deposing a first metal layer on the substrate, and implementing pattern process to the first metal layer with a first mask to form a gate;

step 2, sequentially and continuously deposing a gate isolation layer, an oxide semiconductor layer and an etching stopper layer on the gate and the substrate;

step 3, implementing pattern process to the oxide semiconductor layer and the etching stopper layer with a second halftone mask or a slit diffraction mask to first form an island shaped oxide semiconductor layer and an island shaped etching stopper layer which are stacked up on the gate isolation layer above the gate, and then to form blind holes respectively at two sides of the island shaped oxide semiconductor layer and the island shaped etching stopper layer;

a depth of the blind hole is larger than a thickness of the island shaped etching stopper layer, and smaller than a thickness sum of the island shaped etching stopper layer and the island shaped oxide semiconductor layer;

step 4, deposing a second metal layer on the island shaped etching stopper layer and gate isolation layer, and implementing pattern process to the second metal layer with a third mask to form a source/a drain;

the source/the drain contact with the island shaped oxide semiconductor layer through a bottom surface and part of hole wall of the blind hole;

wherein the step 3 specifically comprises:

step 31, coating photoresist on the etching stopper layer, and implementing exposure, development to the photoresist with a second halftone mask or a slit diffraction mask to obtain a photoresist layer right above the gate, and two sides of the photoresist layer are respectively provided with sunk areas, and a thickness of the photoresist layer in the sunk areas is smaller than a thickness of the photoresist layer outside the sunk areas;

step 32, employing the entire photoresist layer to be a shielding layer to implement dry etching to the etching stopper layer, and then to implement wet etching to the oxide semiconductor layer to form the island shaped oxide semiconductor layer and the island shaped etching stopper layer which are stacked up;

step 33, removing the photoresist layer in the sunk areas, and leaving the photoresist layer outside the sunk areas;

step 34, employing the left photoresist layer to be a shielding layer to implement dry etching to the island shaped etching stopper layer, and then to implement wet etching to the island shaped oxide semiconductor layer to form the blind holes respectively at the two sides of the island shaped oxide semiconductor layer and the island shaped etching stopper layer;

step 35, removing the left photoresist layer;

wherein in the step 1, the first metal layer is deposed by physical vapor deposition, and wet etching is employed for implementing pattern process to the first metal layer;

wherein in the step 2, the gate isolation layer is deposed by chemical vapor deposition, and the oxide semiconductor layer is deposed by sputtering, and the etching stopper layer is deposed by chemical vapor deposition in sequence;

wherein in the step 4, the second metal layer is deposed by physical vapor deposition, and wet etching is employed for implementing pattern process to the second metal layer.

The benefits of the present invention are: the present invention provides a manufacture method of an oxide semiconductor TFT substrate. By continuously forming the gate isolation layer, the oxide semiconductor layer and the etching stopper layer, and implementing pattern process to the oxide semiconductor layer and the etching stopper layer with one halftone mask or a slit diffraction mask to first form an island shaped oxide semiconductor layer and an island shaped etching stopper layer which are stacked up, and then to form blind holes respectively at two sides of the island shaped oxide semiconductor layer and the island shaped etching stopper layer, which can diminish the amount of the masks, to reduce the production cost and raise the production efficiency; and a depth of the blind hole is larger than a thickness of the island shaped etching stopper layer, and smaller than a thickness sum of the island shaped etching stopper layer and the island shaped oxide semiconductor layer, and the source/the drain contact with the island shaped oxide semiconductor layer through a bottom surface and part of hole wall of the blind hole so that the contact area of the source/the drain of the TFT with the oxide semiconductor layer is enlarged to reduce the contact resistance and raise the on state current of the TFT. The present invention provides an oxide semiconductor TFT substrate structure. An island shaped oxide semiconductor layer and an island shaped etching stopper layer which are stacked up are provided. Blind holes are respectively formed at two sides of the island shaped oxide semiconductor layer and the island shaped etching stopper layer, and a depth of the blind hole is larger than a thickness of the island shaped etching stopper layer, and smaller than a thickness sum of the island shaped etching stopper layer and the island shaped oxide semiconductor layer, and the source/the drain contact with the island shaped oxide semiconductor layer through a bottom surface and part of hole wall of the blind hole so that the production cost of the oxide semiconductor layer is low, and the production efficiency is high, and the contact area of the source/the drain of the TFT with the oxide semiconductor layer is enlarged to reduce the contact resistance and raise the on state current of the TFT.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
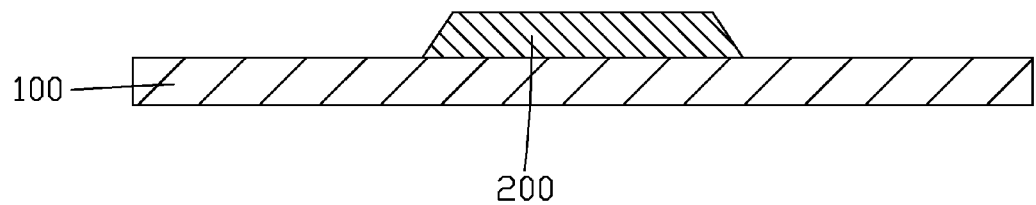
FIG. 1 to FIG. 5 are diagrams of step 1 to step 5 of a manufacture method of a common oxide semiconductor TFT substrate according to prior art.
Figure 2:
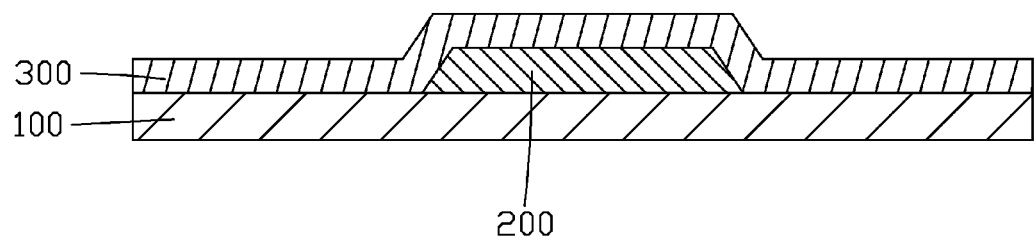
Figure 3:
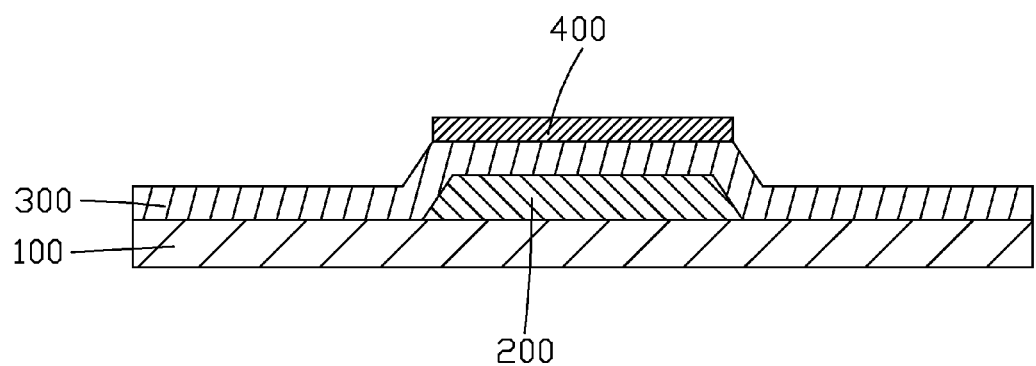
Figure 4:
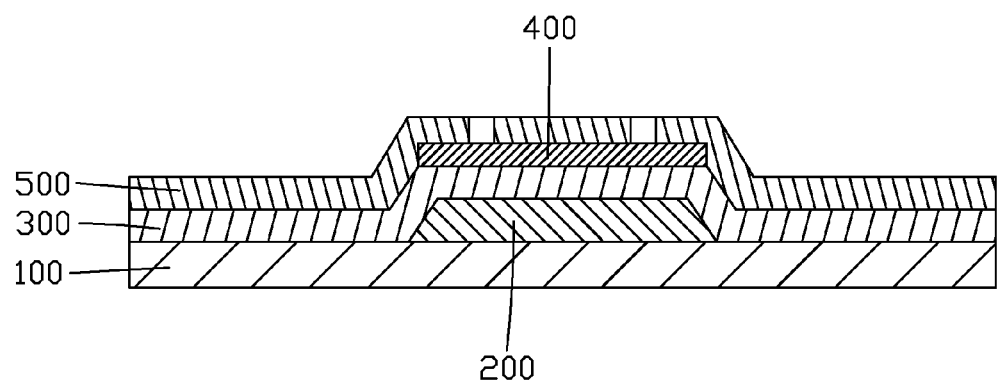
Figure 5:
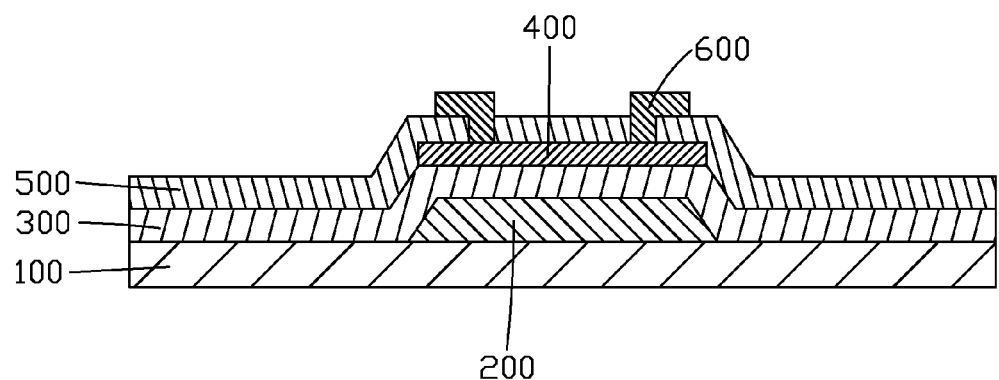
Figure 6:
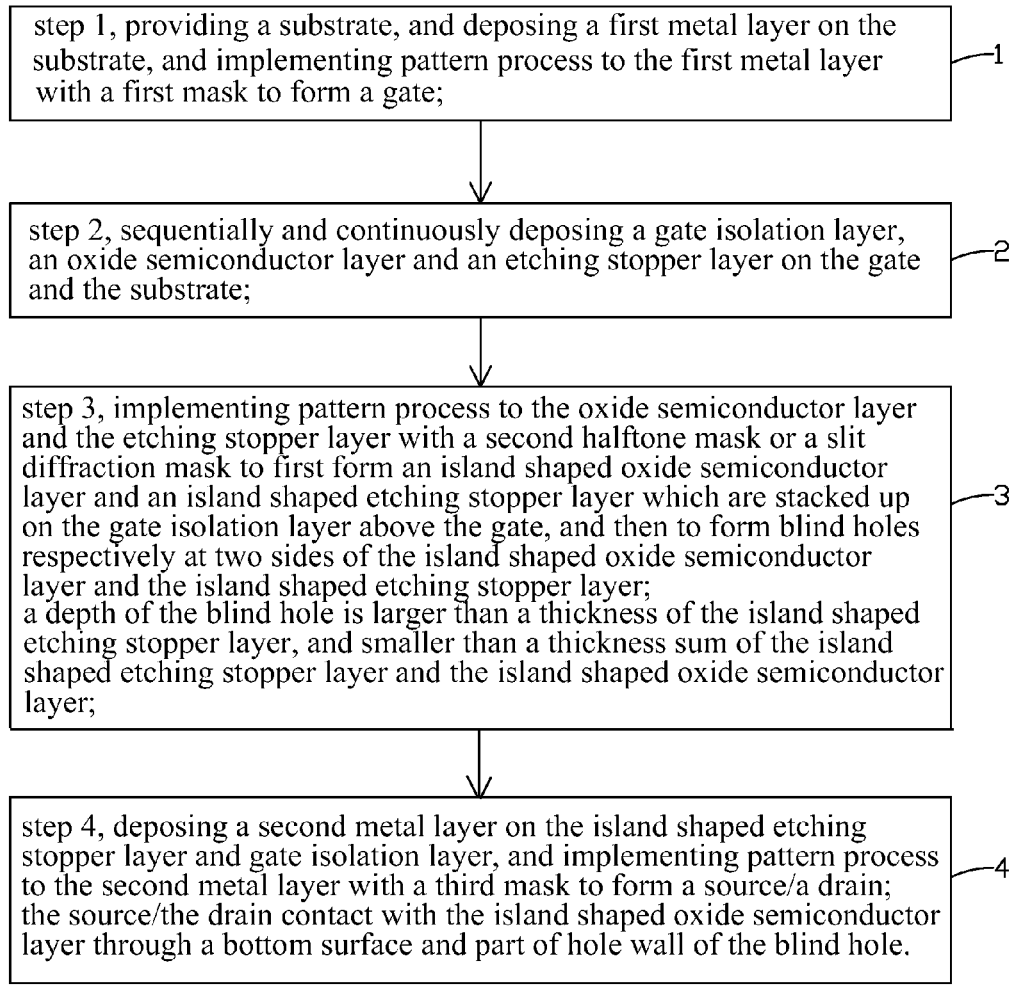
FIG. 6 is a flowchart of a manufacture method of an oxide semiconductor TFT substrate according to the present invention.
Figure 7:
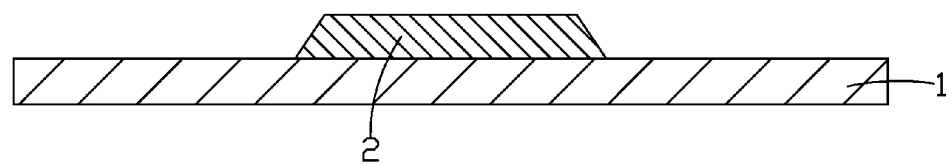
FIG. 7 is a diagram of step 1 of the manufacture method of the oxide semiconductor TFT substrate according to the present invention.

Please refer to FIG. 6. The present invention provides a manufacture method of an oxide semiconductor TFT substrate, comprising steps of:

step 1, as shown in FIG. 7, providing a substrate 1, and deposing a first metal layer on the substrate 1, and implementing pattern process to the first metal layer with a first mask to form a gate 2.

Specifically, in the step 1, the first metal layer is deposed by physical vapor deposition (PVD), and then photoresist is coated, and exposure, development are implemented to the photoresist, and wet etching is employed for implementing pattern process to the first metal layer.

The substrate 1 is a glass substrate.

Figure 8:
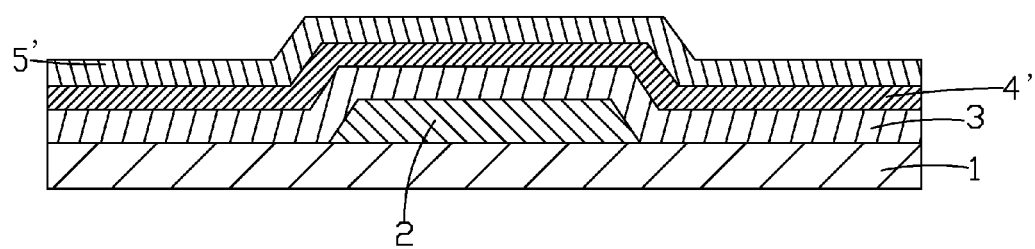
FIG. 8 is a diagram of step 2 of the manufacture method of the oxide semiconductor TFT substrate according to the present invention.

Material of the first metal layer is a stack combination of one or more of molybdenum (Mo), titanium (Ti), aluminum (Al) and copper (Cu).

step 2, as shown in FIG. 8, sequentially and continuously deposing a gate isolation layer 3, an oxide semiconductor layer 4' and an etching stopper layer 5' on the gate 2 and the substrate 1.

Because the gate isolation layer 3, the oxide semiconductor layer 4' and the etching stopper layer 5' are continuously formed, in comparison with prior art, it can prevent the contaminations of the etchant, stripper to the respective contact interfaces due to the separate film formation and etching of the respective layers to promote the interface quality and thus to guarantee the performance of the TFT.

Specifically, in the step 2, the gate isolation layer 3 is deposed by chemical vapor deposition (CVD), and the oxide semiconductor layer 4' is deposed by sputtering, and the etching stopper layer 5' is deposed by chemical vapor deposition in sequence.

Material of the gate isolation layer 3 and the etching stopper layer 5' is Silicon Oxide, Silicon Nitride or a combination of the two. Material of the oxide semiconductor layer 4' is Indium Gallium Zinc Oxide (IGZO).

step 3, referring from FIG. 9 to FIG. 13, implementing pattern process to the oxide semiconductor layer 4' and the etching stopper layer 5' with a second halftone mask or a slit diffraction mask to first form an island shaped oxide semiconductor layer 4 and an island shaped etching stopper layer 5 which are stacked up on the gate isolation layer 3 above the gate 2, and then to form blind holes 54 respectively at two sides of the island shaped oxide semiconductor layer 4 and the island shaped etching stopper layer 5.

A depth of the blind hole 54 is larger than a thickness of the island shaped etching stopper layer 5, and smaller than a thickness sum of the island shaped etching stopper layer 5 and the island shaped oxide semiconductor layer 4. In other words, the blind hole 54 does not only penetrate the island shaped etching stopper layer 5 but also keeps going deep into inside of the island shaped oxide semiconductor layer 4.

Figure 9:
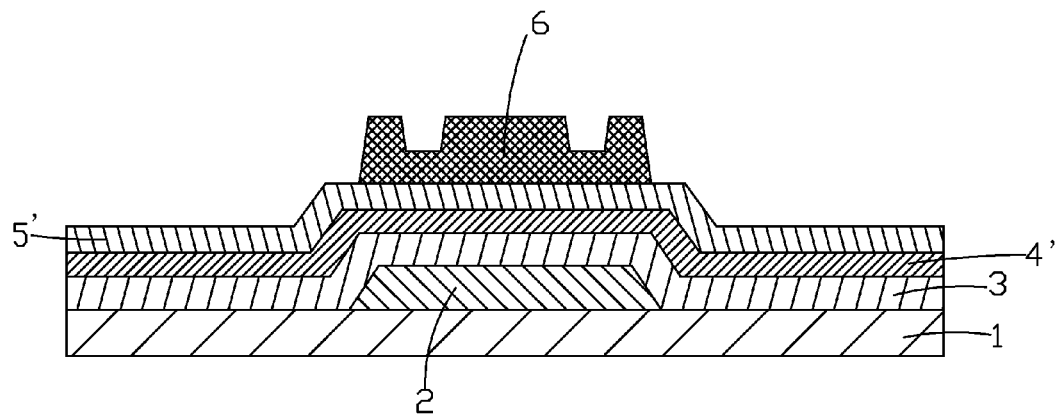
FIG. 9 to FIG. 13 are diagrams of step 3 of the manufacture method of the oxide semiconductor TFT substrate according to the present invention.
Figure 10:
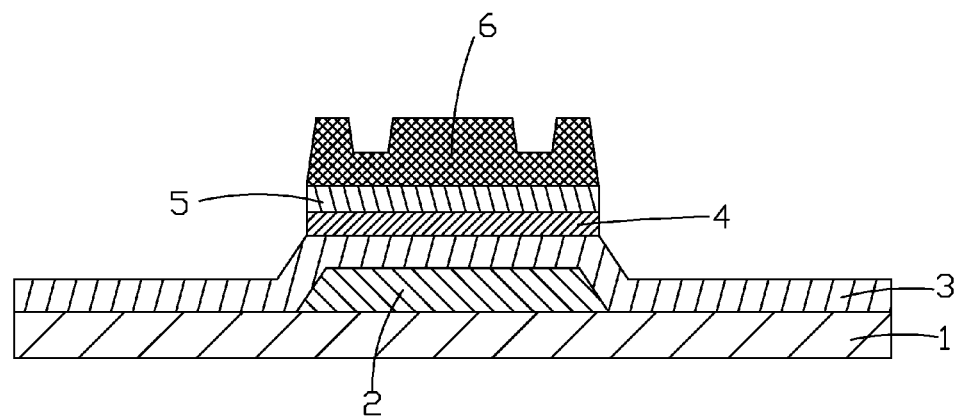
Figure 11:
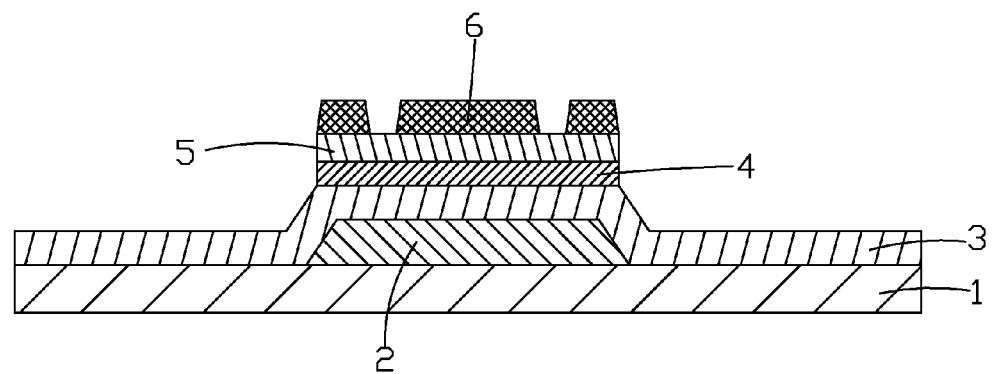
Figure 12:
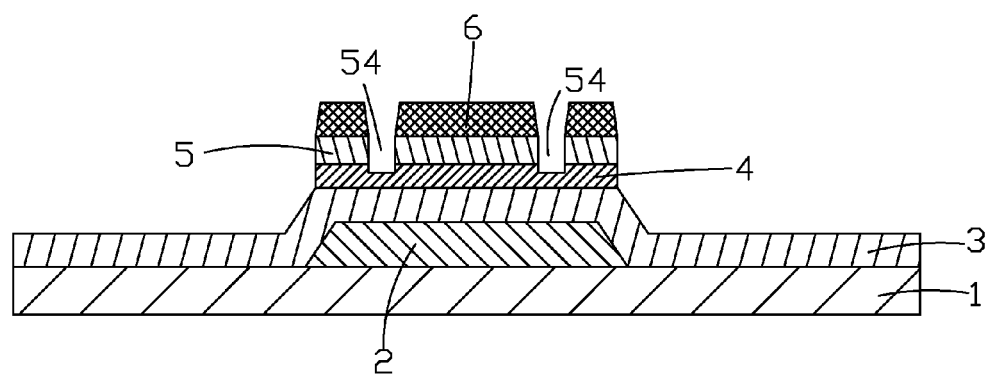
Figure 13:
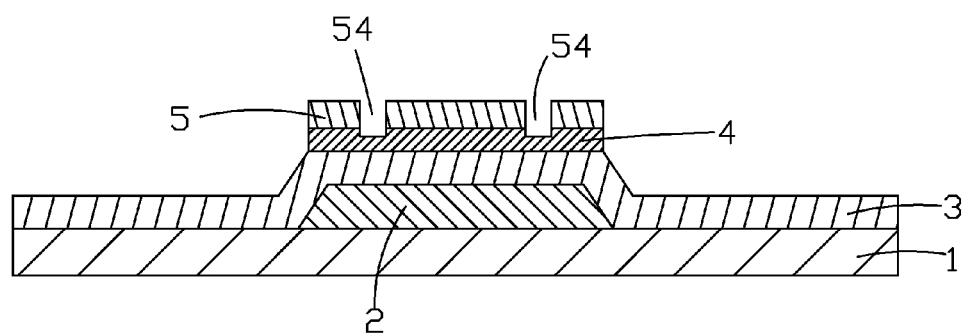

Furthermore, the step 3 specifically comprises:

step 31, as shown in FIG. 9, coating photoresist on the etching stopper layer 5', and implementing exposure, development to the photoresist with a second halftone mask or a slit diffraction mask to obtain a photoresist layer 6 right above the gate 2, and two sides of the photoresist layer 6 are respectively provided with sunk areas, and a thickness of the photoresist layer 6 in the sunk areas is smaller than a thickness of the photoresist layer 6 outside the sunk areas.

step 32, as shown in FIG. 10, employing the entire photoresist layer 6 to be a shielding layer to implement dry etching to the etching stopper layer 5', and then to implement wet etching to the oxide semiconductor layer 4' to form the island shaped oxide semiconductor layer 4 and the island shaped etching stopper layer 5 which are stacked up.

step 33, as shown in FIG. 11, removing the photoresist layer 6 in the sunk areas, and leaving the photoresist layer 6 outside the sunk areas.

step 34, as shown in FIG. 12, employing the left photoresist layer 6 to be a shielding layer to implement dry etching to the island shaped etching stopper layer 5, and then to implement wet etching to the island shaped oxide semiconductor layer 4 to form the blind holes 54 respectively at the two sides of the island shaped oxide semiconductor layer 4 and the island shaped etching stopper layer 5.

step 35, as shown in FIG. 13, removing the left photoresist layer 6.

Figure 14:
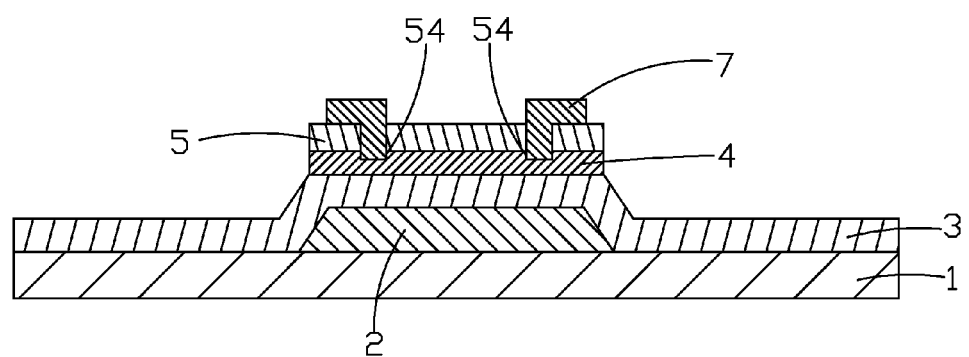
FIG. 14 is a diagram of step 4 in the manufacture method of the oxide semiconductor TFT substrate according to the present invention and a diagram of the oxide semiconductor TFT substrate structure according to the present invention.

In the step 3, only one halftone mask or a slit diffraction mask is utilized to manufacture the island shaped etching stopper layer 5 and the island shaped oxide semiconductor layer 4, and blind holes 54 respectively at two sides of the island shaped oxide semiconductor layer 4 and the island shaped etching stopper layer 5. The amount of the masks is diminished to reduce the production cost and raise the production efficiency.

step 4, as shown in FIG. 14, deposing a second metal layer on the island shaped etching stopper layer 5 and the gate isolation layer 3, and implementing pattern process to the second metal layer with a third mask to form a source/a drain 7.

The source/the drain 7 contact with the island shaped oxide semiconductor layer 4 through a bottom surface and part of hole wall of the blind hole 54, and the contact area of the source/the drain 7 with the oxide semiconductor layer 4 is enlarged to reduce the contact resistance and raise the on state current of the TFT.

Specifically, in the step 4, the second metal layer is deposed by PVD, and then photoresist is coated, and exposure, development are implemented to the photoresist, and wet etching is employed for implementing pattern process to the second metal layer.

Material of the second metal layer is a stack combination of one or more of molybdenum (Mo), titanium (Ti), aluminum (Al) and copper (Cu).

On the basis of the aforesaid manufacture method of the oxide semiconductor TFT substrate, as shown in FIG. 14, the present invention further provides an oxide semiconductor TFT substrate structure, comprising a substrate 1, a gate 2 positioned on the substrate 1, a gate isolation layer 3 covering the gate 2 and the substrate 1, an island shaped oxide semiconductor layer 4 and an island shaped etching stopper layer 5 which are stacked up on the gate isolation layer 3 above the gate 2, and a source/a drain 7. Blind holes 54 are respectively formed at two sides of the island shaped oxide semiconductor layer 4 and the island shaped etching stopper layer 5, and a depth of the blind hole 54 is larger than a thickness of the island shaped etching stopper layer 5, and smaller than a thickness sum of the island shaped etching stopper layer 5 and the island shaped oxide semiconductor layer 4; the source/the drain 7 contact with the island shaped oxide semiconductor layer 4 through a bottom surface and part of hole wall of the blind hole 54.

The island shaped oxide semiconductor layer 4 and the island shaped etching stopper layer 5 which are stacked up and the blind holes 54 can be manufactured with one halftone mask or a slit diffraction mask so that the production cost of the oxide semiconductor layer is low, and the production efficiency is high. A depth of the blind hole 54 is larger than a thickness of the island shaped etching stopper layer 5, and smaller than a thickness sum of the island shaped etching stopper layer 5 and the island shaped oxide semiconductor layer 4; the source/the drain 7 contact with the island shaped oxide semiconductor layer 4 through a bottom surface and part of hole wall of the blind hole 54 so that the contact area of the source/the drain 7 with the oxide semiconductor layer 4 is larger, and the contact resistance is smaller, and the on state current of the TFT is higher.

In conclusion, in the manufacture method of the oxide semiconductor TFT substrate according to the present invention, by continuously forming the gate isolation layer, the oxide semiconductor layer and the etching stopper layer, and implementing pattern process to the oxide semiconductor layer and the etching stopper layer with one halftone mask or a slit diffraction mask to first form an island shaped oxide semiconductor layer and an island shaped etching stopper layer which are stacked up, and then to form blind holes respectively at two sides of the island shaped oxide semiconductor layer and the island shaped etching stopper layer, which can diminish the amount of the masks, to reduce the production cost and raise the production efficiency; and a depth of the blind hole is larger than a thickness of the island shaped etching stopper layer, and smaller than a thickness sum of the island shaped etching stopper layer and the island shaped oxide semiconductor layer, and the source/the drain contact with the island shaped oxide semiconductor layer through a bottom surface and part of hole wall of the blind hole so that the contact area of the source/the drain of the TFT with the oxide semiconductor layer is enlarged to reduce the contact resistance and raise the on state current of the TFT. The present invention provides an oxide semiconductor TFT substrate structure. An island shaped oxide semiconductor layer and an island shaped etching stopper layer which are stacked up are provided. Blind holes are respectively formed at two sides of the island shaped oxide semiconductor layer and the island shaped etching stopper layer, and a depth of the blind hole is larger than a thickness of the island shaped etching stopper layer, and smaller than a thickness sum of the island shaped etching stopper layer and the island shaped oxide semiconductor layer, and the source/the drain contact with the island shaped oxide semiconductor layer through a bottom surface and part of hole wall of the blind hole so that the production cost of the oxide semiconductor layer is low, and the production efficiency is high, and the contact area of the source/the drain of the TFT with the oxide semiconductor layer is enlarged to reduce the contact resistance and raise the on state current of the TFT.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of an oxide semiconductor TFT substrate, comprising steps of:

step 1, providing a substrate, and deposing a first metal layer on the substrate, and implementing pattern process to the first metal layer with a first mask to form a gate;

step 2, sequentially and continuously deposing a gate isolation layer, an oxide semiconductor layer and an etching stopper layer on the gate and the substrate;

step 3, implementing pattern process to the oxide semiconductor layer and the etching stopper layer with a second halftone mask or a slit diffraction mask to first form an island shaped oxide semiconductor layer and an island shaped etching stopper layer which are stacked up on the gate isolation layer above the gate, and then to form blind holes respectively at two sides of the island shaped oxide semiconductor layer and the island shaped etching stopper layer;

a depth of the blind hole is larger than a thickness of the island shaped etching stopper layer, and smaller than a thickness sum of the island shaped etching stopper layer and the island shaped oxide semiconductor layer;

step 4, deposing a second metal layer on the island shaped etching stopper layer and gate isolation layer, and implementing pattern process to the second metal layer with a third mask to form a source/a drain;

the source/the drain contact with the island shaped oxide semiconductor layer through a bottom surface and part of hole wall of the blind hole;

wherein only the first mask is used implement pattern process to the first metal layer, only the second halftone mask or the slit diffraction mask is used implement pattern process to the oxide semiconductor layer and the etching stopper layer and only the third mask is used to implement pattern process to the second metal layer for manufacturing the oxide semiconductor TFT substrate.

2. The manufacture method of the oxide semiconductor TFT substrate according to claim 1, wherein the step 3 specifically comprises:
    step 31, coating photoresist on the etching stopper layer, and implementing exposure, development to the photoresist with a second halftone mask or a slit diffraction mask to obtain a photoresist layer right above the gate, and two sides of the photoresist layer are respectively provided with sunk areas, and a thickness of the photoresist layer in the sunk areas is smaller than a thickness of the photoresist layer outside the sunk areas;
    step 32, employing the entire photoresist layer to be a shielding layer to implement dry etching to the etching stopper layer, and then to implement wet etching to the oxide semiconductor layer to form the island shaped oxide semiconductor layer and the island shaped etching stopper layer which are stacked up;
    step 33, removing the photoresist layer in the sunk areas, and leaving the photoresist layer outside the sunk areas;
    step 34, employing the left photoresist layer to be a shielding layer to implement dry etching to the island shaped etching stopper layer, and then to implement wet etching to the island shaped oxide semiconductor layer to form the blind holes respectively at the two sides of the island shaped oxide semiconductor layer and the island shaped etching stopper layer;
    step 35, removing the left photoresist layer.

3. The manufacture method of the oxide semiconductor TFT substrate according to claim 1, wherein material of the island shaped oxide semiconductor layer is IGZO.

4. The manufacture method of the oxide semiconductor TFT substrate according to claim 1, wherein material of the island shaped etching stopper layer is Silicon Oxide, Silicon Nitride or a combination of the two.

5. The manufacture method of the oxide semiconductor TFT substrate according to claim 1, wherein material of the gate isolation layer is Silicon Oxide, Silicon Nitride or a combination of the two.

6. The manufacture method of the oxide semiconductor TFT substrate according to claim 1, wherein material of the gate and the source/the drain is a stack combination of one or more of molybdenum, titanium, aluminum and copper.

7. The manufacture method of the oxide semiconductor TFT substrate according to claim 1, wherein in the step 1, the first metal layer is deposed by physical vapor deposition, and wet etching is employed for implementing pattern process to the first metal layer.

8. The manufacture method of the oxide semiconductor TFT substrate according to claim 1, wherein in the step 2, the gate isolation layer is deposed by chemical vapor deposition, and the oxide semiconductor layer is deposed by sputtering, and the etching stopper layer is deposed by chemical vapor deposition in sequence.

9. The manufacture method of the oxide semiconductor TFT substrate according to claim 1, wherein in the step 4, the second metal layer is deposed by physical vapor deposition, and wet etching is employed for implementing pattern process to the second metal layer.

10. A manufacture method of an oxide semiconductor TFT substrate, comprising steps of:
    step 1, providing a substrate, and deposing a first metal layer on the substrate, and implementing pattern process to the first metal layer with a first mask to form a gate;
    step 2, sequentially and continuously deposing a gate isolation layer, an oxide semiconductor layer and an etching stopper layer on the gate and the substrate;
    step 3, implementing pattern process to the oxide semiconductor layer and the etching stopper layer with a second halftone mask or a slit diffraction mask to first form an island shaped oxide semiconductor layer and an island shaped etching stopper layer which are stacked up on the gate isolation layer above the gate, and then to form blind holes respectively at two sides of the island shaped oxide semiconductor layer and the island shaped etching stopper layer;
    a depth of the blind hole is larger than a thickness of the island shaped etching stopper layer, and smaller than a thickness sum of the island shaped etching stopper layer and the island shaped oxide semiconductor layer;
    step 4, deposing a second metal layer on the island shaped etching stopper layer and gate isolation layer, and implementing pattern process to the second metal layer with a third mask to form a source/a drain;
    the source/the drain contact with the island shaped oxide semiconductor layer through a bottom surface and part of hole wall of the blind hole;
    wherein the step 3 specifically comprises:
    step 31, coating photoresist on the etching stopper layer, and implementing exposure, development to the photoresist with a second halftone mask or a slit diffraction mask to obtain a photoresist layer right above the gate, and two sides of the photoresist layer are respectively provided with sunk areas, and a thickness of the photoresist layer in the sunk areas is smaller than a thickness of the photoresist layer outside the sunk areas;
    step 32, employing the entire photoresist layer to be a shielding layer to implement dry etching to the etching stopper layer, and then to implement wet etching to the oxide semiconductor layer to form the island shaped oxide semiconductor layer and the island shaped etching stopper layer which are stacked up;
    step 33, removing the photoresist layer in the sunk areas, and leaving the photoresist layer outside the sunk areas;
    step 34, employing the left photoresist layer to be a shielding layer to implement dry etching to the island shaped etching stopper layer, and then to implement wet etching to the island shaped oxide semiconductor layer to form the blind holes respectively at the two sides of the island shaped oxide semiconductor layer and the island shaped etching stopper layer;
    step 35, removing the left photoresist layer;
    wherein in the step 1, the first metal layer is deposed by physical vapor deposition, and wet etching is employed for implementing pattern process to the first metal layer;
    wherein in the step 2, the gate isolation layer is deposed by chemical vapor deposition, and the oxide semiconductor layer is deposed by sputtering, and the etching stopper layer is deposed by chemical vapor deposition in sequence;
    wherein in the step 4, the second metal layer is deposed by physical vapor deposition, and wet etching is employed for implementing pattern process to the second metal layer;
    wherein only the first mask is used implement pattern process to the first metal layer, only the second halftone mask or the slit diffraction mask is used implement pattern process to the oxide semiconductor layer and the etching stopper layer and only the third mask is used to implement pattern process to the second metal layer for manufacturing the oxide semiconductor TFT substrate.

11. The manufacture method of the oxide semiconductor TFT substrate according to claim 10, wherein material of the island shaped oxide semiconductor layer is IGZO.

12. The manufacture method of the oxide semiconductor TFT substrate according to claim 10, wherein material of the island shaped etching stopper layer is Silicon Oxide, Silicon Nitride or a combination of the two.

13. The manufacture method of the oxide semiconductor TFT substrate according to claim 10, wherein material of the gate isolation layer is Silicon Oxide, Silicon Nitride or a combination of the two.

14. The manufacture method of the oxide semiconductor TFT substrate according to claim 10, wherein material of the gate and the source/the drain is a stack combination of one or more of molybdenum, titanium, aluminum and copper.

* * * * *